(12) United States Patent
Mirhaj et al.

(10) Patent No.: US 11,538,509 B2
(45) Date of Patent: Dec. 27, 2022

(54) COMPUTE-IN-MEMORY WITH TERNARY ACTIVATION

(71) Applicant: QUALCOMM Incorporated, San Diego, CA (US)

(72) Inventors: Seyed Arash Mirhaj, Poway, CA (US); Ankit Srivastava, San Diego, CA (US); Sameer Wadhwa, San Diego, CA (US); Ren Li, San Diego, CA (US); Suren Mohan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/204,649

(22) Filed: Mar. 17, 2021

(65) Prior Publication Data

US 2022/0301605 A1 Sep. 22, 2022

(51) Int. Cl.
| | |
|---|---|
| *G11C 11/419* | (2006.01) |
| *G11C 7/12* | (2006.01) |
| *G11C 7/10* | (2006.01) |
| *G11C 7/18* | (2006.01) |

(52) U.S. Cl.
CPC .............. *G11C 7/12* (2013.01); *G11C 7/1012* (2013.01); *G11C 7/1051* (2013.01); *G11C 7/18* (2013.01)

(58) Field of Classification Search
CPC ...................................................... G11C 7/12
See application file for complete search history.

(56) References Cited

U.S. PATENT DOCUMENTS

| | | | |
|---|---|---|---|
| 8,166,218 B2* | 4/2012 | Rajamani | G11C 7/10 710/36 |
| 9,722,828 B2 | 8/2017 | Sun et al. | |
| 10,825,510 B2 | 11/2020 | Jaiswal et al. | |
| 2014/0269010 A1* | 9/2014 | Dally | G11C 11/4096 365/203 |
| 2019/0042199 A1 | 2/2019 | Sumbul et al. | |
| 2019/0080231 A1 | 3/2019 | Nestler et al. | |
| 2019/0102359 A1 | 4/2019 | Knag et al. | |
| 2020/0126620 A1 | 4/2020 | Makosiej | |
| 2020/0233923 A1 | 7/2020 | Knag et al. | |
| 2020/0327401 A1 | 10/2020 | Bates et al. | |

(Continued)

FOREIGN PATENT DOCUMENTS

| | | |
|---|---|---|
| CN | 113255904 A | 8/2021 |
| GB | 2583121 A | 10/2020 |

(Continued)

OTHER PUBLICATIONS

Jia et al. "A programmable heterogeneours microprocessor based on bit-scalable in-memory computing", IEEE J of Solid-State circuits. Aug. 7, 2020 (Year: 2020).*

(Continued)

*Primary Examiner* — Min Huang
(74) *Attorney, Agent, or Firm* — Chui-kiu Teresa Wong (57) ABSTRACT

A compute-in-memory bitcell is provided that includes a pair of cross-coupled inverters for storing a stored bit. The compute-in-memory bitcell includes a logic gate formed by a pair of switches for multiplying the stored bit with an input vector bit. A controller controls the pair of switches responsive to a sign bit during a computation phase of operation and controls the pair of switches responsive to a magnitude bit during an execution phase of operation.

25 Claims, 9 Drawing Sheets

(56) References Cited

U.S. PATENT DOCUMENTS

| | | |
|---|---|---|
| 2021/0005230 A1 | 1/2021 | Wang et al. |
| 2021/0193669 A1 | 6/2021 | Ahmed et al. |
| 2021/0271597 A1* | 9/2021 | Verma ................. G11C 11/4074 |
| 2021/0327474 A1 | 10/2021 | Seok et al. |
| 2022/0230679 A1 | 7/2022 | Mirhaj |

FOREIGN PATENT DOCUMENTS

| | | |
|---|---|---|
| WO | 2020139895 A1 | 7/2020 |
| WO | 2021002990 A1 | 1/2021 |

OTHER PUBLICATIONS

International Search Report and Written Opinion—PCT/US2022/019856—ISA/EPO—dated Jun. 13, 2022.

Jiang Z., et al., "C3SRAM: In-Memory-Computing SRAM Macro Based on Capacitive-Coupling Computing", IEEE Solid-State Circuits Letters, vol. 2, No. 9, Sep. 2019, pp. 131-134.

Naresh, B., et al., "A novel 8T SRAM with Improved Cell Density", Analog Integrated Circuits and Signal Processing, Springer New York LLC, US, vol. 98, No. 2, Aug. 31, 2019 (Aug. 31, 2018), XP036693791, pp. 357-366, ISSN: 0925-1030, DOI: 10.1007/S10470-018-1309-Z [retrieved on Aug. 31, 2018] 2.2 Proposed 8T SRAM Cell, p. 358, Figure 2.

Valavi, H., et al., "A 64-Title 2.4-Mb In-Memory-Computing CNN Accelerator Charge-Domain Compute", IEEE Journal of Solid-State Circuits, IEEE, USA, vol. 54, No. 6, Jun. 1, 2019 (Jun. 1, 2019), XP011726793, pp. 1789-1799, ISSN: 0018-9200, DOI: 10.1109/JSSC.2019.2899730 [retrieved on May 23, 2019] Section 3) Multiplying Bit-Cell, p. 1791-p. 1792, Figures 5, 6.

\* cited by examiner

COMPUTE-IN-MEMORY WITH TERNARY ACTIVATION

TECHNICAL FIELD

This application relates to compute-in-memories, and more particularly to a compute-in-memory with ternary activation.

BACKGROUND

Unlike a traditional bitcell, a compute-in-memory (CiM) bitcell not only stores a bit but also includes a logic gate for the multiplication of the stored bit with an input bit. CiM greatly speeds up the computing time for applications such as artificial intelligence as the resulting multiplication does not require the retrieval of bits from a memory to be transported to an arithmetic logic unit for the subsequent multiplication as would be performed in a classic Von Neumann computer architecture. Instead, the multiplication occurs at the memory itself.

Although a compute-in-memory bitcell is advantageous as compared to traditional bitcells for computation-intensive applications such as artificial intelligence, an issue arises with regard to accommodating a sign (positive or negative) for the input bit that is multiplied with the compute-in-memory bitcell's stored bit. To accommodate a sign, a binary-zero value for the input bit may be deemed to represent −1. In this accommodation, a collection of the input bits forms an input vector. Since binary zero is mapping to −1, each input vector represents an odd number. For example, −7 may be represented by the input vector [−1, −1, −1] whereas 7 may be represented by the input vector [1, 1, 1]. This limitation to odd numbers for the input vector in a signed implementation lowers the computation precision. In addition, substantial energy may be consumed by the charging and discharging of a capacitor in the compute-in-memory bitcell with such a conventional signed implementation.

SUMMARY

A memory is provided that includes: a bitcell having a pair of switches connected to an output node; a capacitor coupled to the output node; a first storage element and a plurality of additional storage elements; and a controller configured to select a first bit from the first storage element to control the pair of switches responsive to the first bit during a first phase of operation for the memory and configured to select a second bit from the plurality of additional storage elements to control the pair of switches responsive to the second bit during a second phase of operation for the memory.

In addition, a method of controlling a bitcell to multiply a stored bit with a signed input bit is provided that includes: during a first phase of operation and responsive to a sign of the signed input bit having a first binary value, closing a first switch that is coupled between a node for the stored bit and an output node and opening a second switch that is coupled between a node for a complement of the stored bit and the output node; during the first phase of operation and responsive to the sign of the signed bit having a second binary value, opening the first switch and closing the second switch; during a second phase of operation and responsive to a magnitude of the signed input bit having the first binary value, reversing a switching state of the first switch and the second switch established during the first phase of operation; and during the second phase of operation and responsive to the magnitude of the signed input bit having the second binary value, maintaining the switching state of the first switch and the second switch established during the first phase of operation.

Moreover, a memory is provided that includes: a bitcell configured to store a stored bit, the bitcell including a first switch coupled between a node for the stored bit and an output node and a second switch coupled between a node for a complement of the stored bit and the output node; a capacitor having a first plate connected to the output node; and a controller configured to open the second switch and to close the first switch responsive to a sign of an input word having a first binary value and to open the first switch and to close the second switch responsive to a sign bit of the input word having a second binary value to control a switching state of the first switch and of the second switch in a first phase of operation, wherein the second binary value is a complement of the first binary value.

Finally, a method of operation for a compute-in-memory is provided that includes: during a first phase of operation, controlling a pair of switches coupled between a bitcell and a plate of a capacitor responsive to a sign bit; and during a second phase of operation controlling the pair of switches responsive to a magnitude bit.

These and other advantageous features may be better appreciated through the following detailed description.

Embodiments of the present disclosure and their advantages are best understood by referring to the detailed description that follows. It should be appreciated that like

DETAILED DESCRIPTION

In deep learning and other machine learning applications, a convolutional layer is a fundamental building block. A convolutional layer includes a collection of nodes for the multiplication of filter weight bits with an input vector from a previous layer (or from input data such as an image being analyzed). The nodes may also be designated as neurons. To increase the processing speed, the neurons or nodes are implemented using compute-in-memory bitcells. To provide increased computing precision and decrease power consumption, a ternary computation technique is provided in which the input vector may have odd or even signed values. This technique is denoted as a "ternary" computation technique because the resulting computation at the compute-in-memory bitcell may either increase, leave unchanged, or decrease a voltage of a read bit line.

Figure 1:
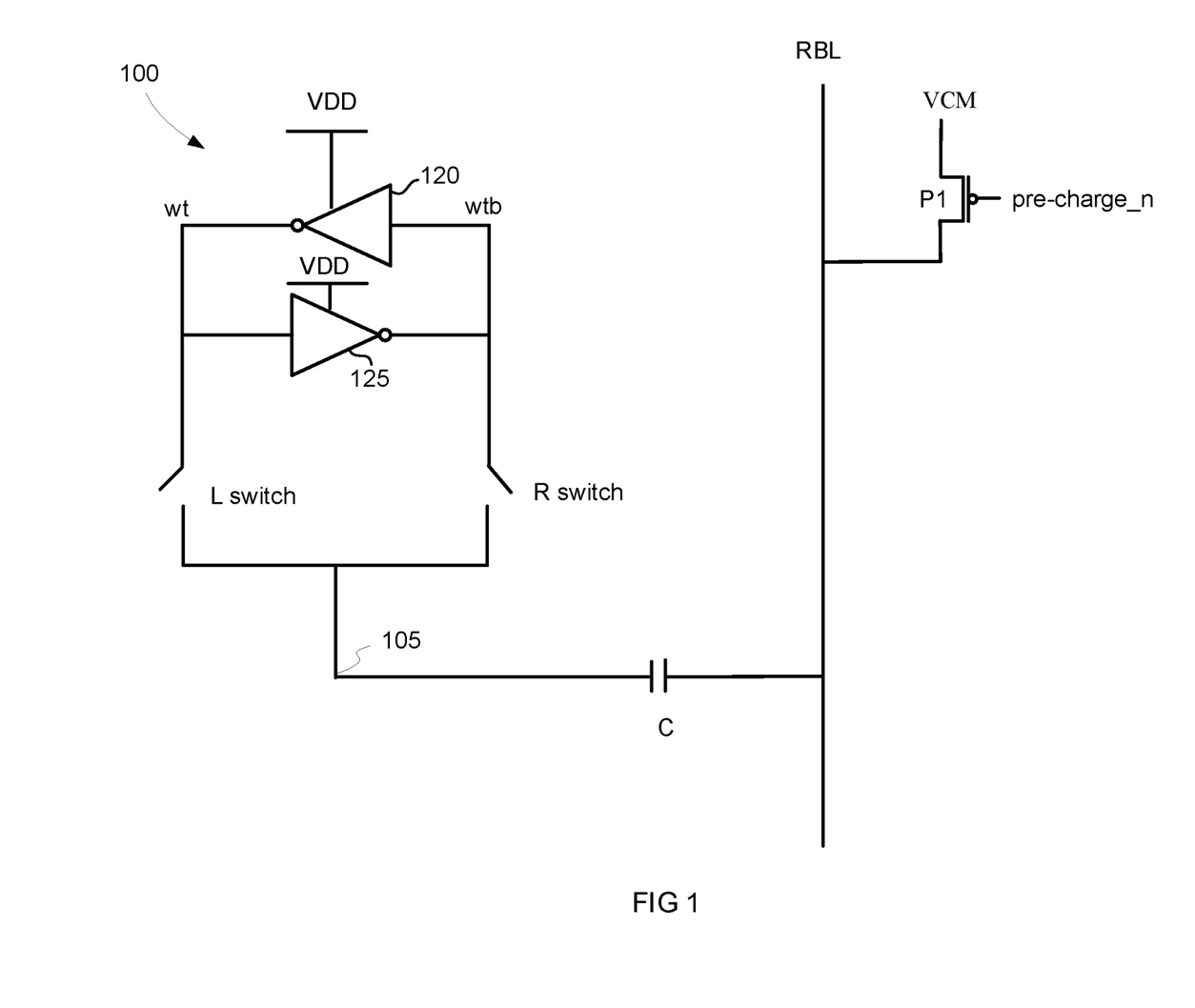
FIG. 1 is a circuit diagram of a compute-in-memory bitcell including a pair of switches in accordance with an aspect of the disclosure.

The ternary computation disclosed herein is also referred to as a ternary activation. The ternary computation may be practiced with any suitable compute-in-memory bitcell that includes a pair of switches and a capacitor. An example compute-in-memory (CiM) bitcell 100 is shown in FIG. 1. A pair of cross-coupled inverters 120 and 125 stores a bit on an output node wt. This stored bit as also referred to as a filter weight bit. The output node wt will thus also be denoted as a filter weight bit node wt. The pair of cross-coupled inverters 120 and 125 also stores a complement filter weight bit (the complement of the filter weight bit) on a complement filter weight bit node wtb. The filter weight bit node wt is an output node for inverter 120 whereas the complement filter weight bit node wtb is an output node for inverter 125. A logic gate in compute-in-memory bitcell 100 is formed by a left (L) switch and a (R) switch. The L switch couples between the filter weight bit node wt and an output node 105. Similarly, the R switch couples between the complement filter weight bit node wtb and the output node 105. A capacitor C couples between the output node 105 and a read bit line (RBL). As used herein, the term "bitcell" for a CiM application will be understood to refer to inverters 120 and 125 and the L and R switches as these devices are formed by transistors implemented on a semiconductor die. In contrast, the capacitor C is a passive device that may be shared by other CiM bitcells in alternative implementations.

Compute-in-memory bitcell 100 calculates the multiplication of the filter weight bit with a signed input bit. The signed input bit is a bit within a signed input vector. The signed input vector may also be denoted as a signed input word. To better appreciate the advantageous ternary activation disclosed herein for the multiplication of the signed input bit with the filter weight bit, a signed multiplication with an input vector having only odd magnitudes will be discussed first. As noted earlier, a signed implementation for the input vector typically limits the input bits for the signed input vector to be considered as representing either −1 or 1. For example, a binary zero for an input bit may be mapped to −1 whereas a binary one is mapped to 1. In such a mapping, the signed input vector can then represent only odd numbers. For example, an input vector of [−1, −1, −1] represents a signed value of −7. Similarly, an input vector of [1, 1, 1] represents a signed value of 7. In this fashion, a 3-bit-wide input vector in an odd-number-only signed representation may represent the odd values of −7, −5, −3, −1, 1, 3, 5, and 7 depending upon the binary values of the individual input bits.

In one implementation, each of the L and R switches is implemented using a transmission gate. A transmission gate may pass both a strong zero (passing ground through the transmission gate) and a strong one (passing a power supply voltage VDD through the transmission gate) but requires both a p-type metal-oxide semiconductor (PMOS) transistor and an n-type metal-oxide semiconductor (NMOS) transistor. A single transistor such as a PMOS transistor may also be used to implement each L and R switch but a PMOS transistor cannot pass a strong zero but instead can only pass a strong one and a weak zero (a positive voltage rather than ground due to the transistor threshold voltage requirement).

The number of phases of operation for compute-in-memory bitcell 100 to perform a multiplication of the input bit with the filter weight bit depends upon whether both a strong zero and a strong one may be passed by the switch implementation. In the multiplication, the end result will be either a grounding of the output node 105 (passing a strong zero) or a charging of the output node 105 to the power supply voltage VDD (passing a strong one). Since a PMOS implementation of the L and R switches cannot pass a strong zero, the output node 105 is first grounded in a pre-charge phase. But a transmission gate implementation for the L and R switches can pass a strong zero so there is no need for a pre-charge phase in a transmission gate implementation. The following discussion of the odd-number-only signed multiplication will assume that the L and R switches are transmission gates so that the multiplication occurs through a computation phase of operation and an accumulation phase of operation. If instead the L and R switches were implemented using PMOS transistors, the pre-charge phase of operation is necessary so that the output node 105 may initially be discharged (e.g., to ground) to be a binary zero. The ensuing computation phase may then leave the output node 105 discharged to represent a binary zero or may charge the output node 105 to the power supply voltage VDD to represent a binary one.

Prior to the computation phase, the read bit line is pre-charged by switching on a pre-charge PMOS transistor P1. The source of pre-charge transistor P1 connects to a node for a common-mode voltage VCM. This common-mode voltage VCM may equal the power supply voltage VDD in some implementations or may be a fraction of the power supply voltage VDD in alternative implementations. The following discussion will assume that the common-mode voltage VCM equals one-half of the power supply voltage VDD without loss of generality. Regardless of whether there is a pre-charge phase or not, pre-charge transistor P1 remains on during the computation phase to keep the read bit line charged to the common-mode voltage VCM.

In the computation phase, the R switch is closed, and the L switch opened if the input bit is a binary zero (which maps to −1 as discussed above). If the filter weight bit is a binary one, the R switch then passes a zero to ground output node 105 such that the capacitor C is charged to the reference voltage VCM. Conversely, if the filter weight bit is a binary zero, the output node 105 is charged to the power supply voltage VDD during the computation phase such that the capacitor C is discharged in implementations in which the reference voltage VCM equals the power supply voltage VDD.

The switches are controlled in a complementary fashion if the input bit is a binary one. In that case, it is the L switch that is closed and the R switch that is opened during the computation phase. If the filter weight bit is a binary one, then the output node 105 is charged to the power supply voltage VDD such that the capacitor C is charged to −VCM.

If the filter weight bit is a zero, then the output node 105 remains discharged such that the capacitor C remains charged to VCM.

The input bit may also be denoted as an activation bit that is part of an activation vector. The resulting relationship between the activation (Act) bit, the filter weight bit (Wt) and the binary state of the output node (Out) in a computation phase for implementations in which the input vector has only odd magnitudes may be summarized in the following Table 1:

TABLE 1

| Act | Wt | Out |
|-----|----|----|
| 0 | 0 | 1 |
| 0 | 1 | 0 |
| 1 | 0 | 0 |
| 1 | 1 | 1 |

It may thus be seen that the binary state of the output node voltage (0 representing ground and 1 representing the power supply voltage VDD) is an exclusive-not-OR (XNOR) of the activation and filter weight bits such that the resulting CiM computation may be designated as an XNOR-based computation.

An accumulation phase follows the computation phase. In the accumulation phase, the pre-charge transistor P1 is switched off so that the read bit line floats. The output node 105 is then grounded. If the capacitor C was charged to −VCM in the computation phase, the read bit line voltage is then pulled below the common mode voltage VCM. Conversely, if the capacitor C remains charged in the computation phase, the read bit line voltage is unaffected in the accumulation phase. Note that the read bit line extends across a column of CiM bitcells (not illustrated in FIG. 1) that includes bitcell 100. In the accumulation phase, the capacitors C for the column thus all have their bottom plates grounded through the grounding of the respective output nodes 105. The capacitors C all have a top plate or terminal coupled to the read bit line. The read bit line thus accumulates a shared charge from all the capacitors C in the accumulation phase.

Since the activation bit is either a binary zero or a binary one, the representation of negative and positive signs for the corresponding odd-magnitude-only activation vector from which the activation bit is derived may require that zero be mapped to a −1 (1 is still a 1). Although the resulting XNOR-based computation is more efficient than if a traditional Von Neumann computer architecture was used, the limitation to just odd numbers for the signed activation vector lowers the computation precision. In addition, substantial energy may be consumed by the charging and discharging of the capacitor C in the transition from the computation phase to the accumulation phase.

To lower power consumption and increase precision, a ternary computation scheme is provided for a capacitive CiM bitcell. The capacitive CiM bitcell may be arranged as discussed previously for CiM bitcell 100 in the XNOR-based computation scheme. There is thus a L switch and a R switch that are controlled in a ternary computation. If these L and R switches are transmission gates, only a computation phase and an execution phase is necessary. If instead PMOS transistors were used to form the L and R switches, a pre-charge phase may be included as will be discussed further below.

Figure 2:
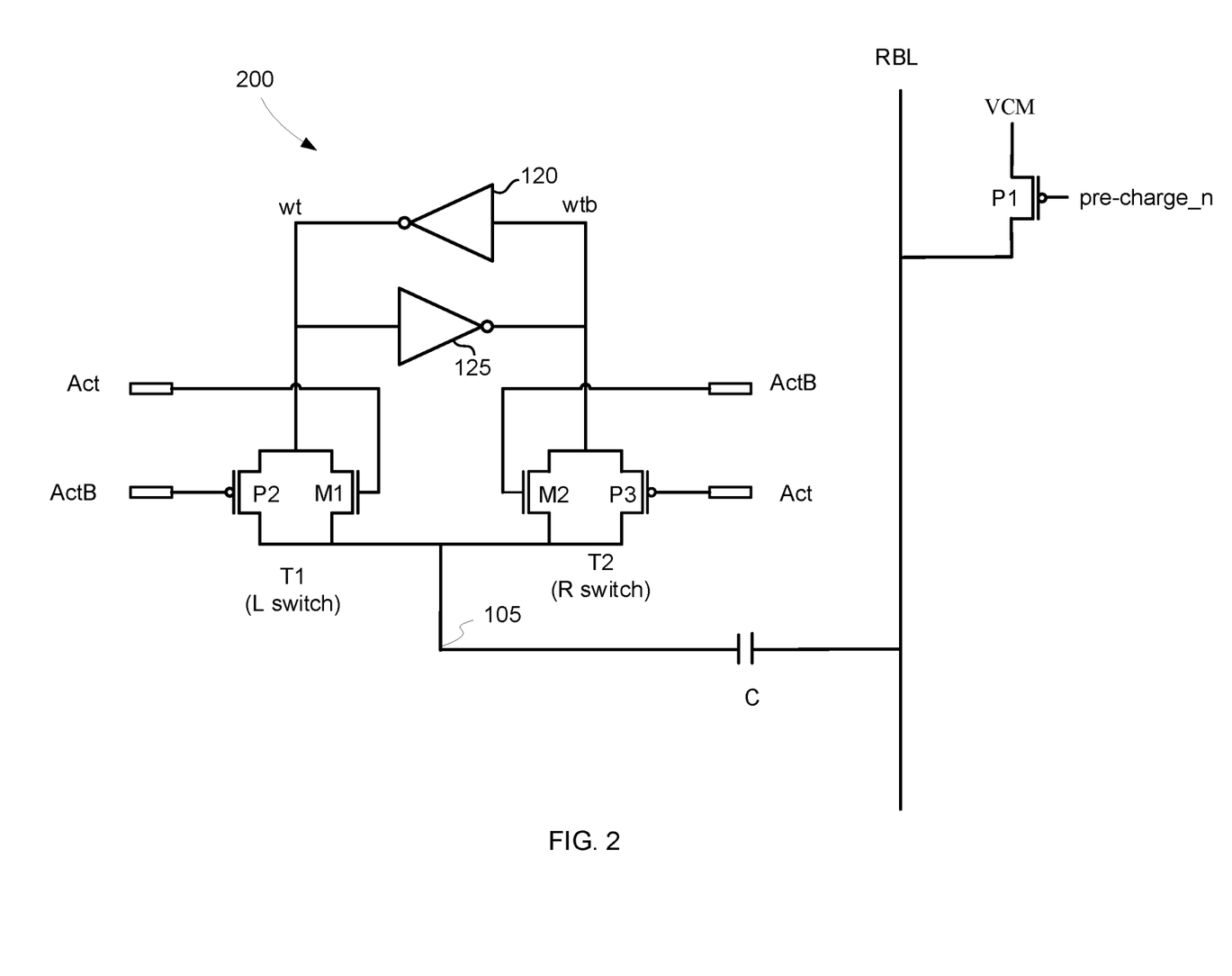
FIG. 2 illustrates an implementation of the compute-in-memory bitcell of FIG. 1 in which the pair of switches comprises a pair of transmission gates in accordance with an aspect of the disclosure.

A transmission-gate implementation for an example CiM bitcell 200 is shown in FIG. 2. Inverters 120 and 125, the read bit line RBL, and pre-charge transistor P1 are arranged as discussed for bitcell 100. The filter weight bit node wt (the output of inverter 120) couples through a transmission gate T1 that forms the L switch to the output node 105. Capacitor C couples between the output node 105 and the read bit line RBL as discussed for bitcell 100. A PMOS transistor P2 arranged in parallel with an NMOS transistor M1 forms transmission gate T1. The activation bit signal (Act) controls the gate of transistor M1 whereas a complement of the activation bit signal (ActB) controls the gate of transistor P2. Transmission gate T1 is thus closed when the activation bit signal is true (a binary one in an active-high implementation) and opened when the activation bit signal is false (a binary zero in an active-high implementation). It will be appreciated that an active-low activation bit signal may be used in alternative implementations.

A transmission gate T2 forming the R switch is analogous as it also is formed by a parallel combination of a PMOS transistor P3 and an NMOS transistor M2. The complement activation bit signal (ActB) controls the gate of transistor M2 whereas the activation bit signal (Act) controls the gate of transistor P3. Transmission gate T2 is thus closed when the activation bit signal is false (a binary zero in an active-high implementation) and opened when the activation bit signal is true (a binary one in an active-high implementation). Since the transmission gates T1 and T2 can pass both a strong one and a strong zero there is no need for a pre-charge phase of operation for bitcell 200 to ground output node 105 while the read bit line is pre-charged through the switching on of transistor P1.

Figure 3:
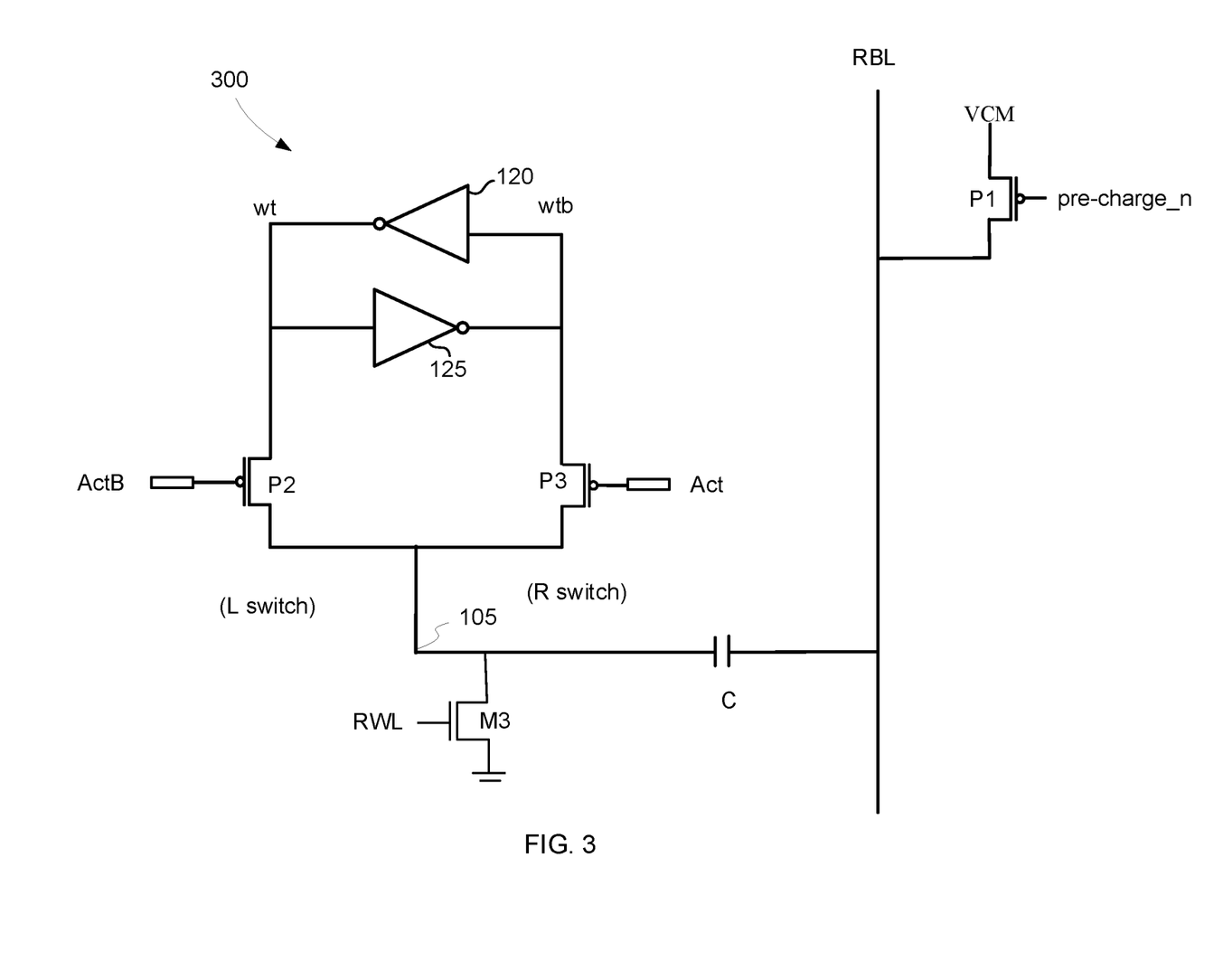
FIG. 3 illustrates an implementation of the compute-in-memory bitcell of FIG. 1 in which the pair of switches comprises a pair of PMOS transistors in accordance with an aspect of the disclosure.

Referring now to FIG. 3, an alternative compute-in-memory bitcell 300 is shown in which the L and R switches cannot pass a strong zero. Inverters 120 and 125, the read bit line RBL, and pre-charge transistor P1 are arranged as discussed for bitcell 100. The PMOS transistor P2 forms the L switch coupling between the filter weight bit node wt and the output node 105. The PMOS transistor P3 forms the R switch coupling between the complement filter weight bit node wtb and the output node 105. Capacitor C couples between the output node 105 and the read bit line as discussed for bitcells 100 and 200. The complement activation bit signal ActB controls the gate of transistor P2. The left switch is thus switched on when the activation bit signal Act is true. Similarly, the activation bit signal Act controls the gate of transistor P3 so that transistor P3 is switched on when the activation bit signal is false.

Since neither transistor P2 and P3 can pass a strong zero, the output node 105 is initially discharged by an NMOS reset transistor M3 in a pre-charge phase of operation. The source of transistor M3 connects to ground whereas its drain connects to output node 105. A read word line (RWL) controls the gate of transistor M3. The read word line RWL is asserted during the initial pre-charge phase during which the pre-charge transistor P1 is also on. Transistor M3 is thus switched on during the pre-charge phase operation so that capacitor C can be charged to the common-mode voltage VCM. The pre-charge phase of operation is unnecessary for a transmission-gate implementation such as discussed for bitcell 200.

Regardless of whether a pre-charge phase of operation is used or not, the sign of a signed activation vector may be represented by a sign bit. The activation bits (which may also be denoted as magnitude bits) for the signed activation vector may be arranged from a least-significant bit (LSB) to a most-significant bit (MSB) as in a conventional binary word. For example, in a three-bit-wide signed activation vector, the activation bits may range from [0 0 0] to [1 1 1].

In such a three-bit-wide implementation, for example, the activation bit portion for a signed activation vector value of 5 or −5 may thus both be represented by [011]. The sign bit is either a 0 or a 1 to represent the negative or positive sign of the signed activation vector, respectively. If the sign bit is multiplied with an activation bit, the result may have one of four possible values: −1, −0, 0, and 1.

Given these four possible values for the multiplication of the sign bit with an activation bit, the computation phase in a ternary computation is quite different from the conventional XNOR-based computation discussed earlier. In the XNOR-based computation, the control of the L and the R switches depended on the binary state of the activation bit. But in a ternary computation phase, the control of the L and R switches depends solely on the sign bit as shown in the following Table 2.

TABLE 2

| Sign bit | Act bit | Computation Phase | Execution Phase |
|---|---|---|---|
| 1 | 1 | L closed, R opened | L opened, R closed |
| 1 | 0 | L closed, R opened | L closed, R opened |
| 0 | 0 | L opened, R closed | L opened, R closed |
| 0 | 1 | L opened, R closed | L closed, R opened |

In the computation phase, the L switch is closed and the R switch is opened if the sign bit is positive (equaling a one in an active-high implementation) regardless of the value of the activation bit. The pre-charge transistor P1 remains on during the computation phase. Conversely, the R switch is closed and the L switch is opened during the computation phase if the sign bit is negative (equaling a zero in an active-high implementation). Again, this control of the R and L switches by the negative sign bit is independent of the value of the corresponding activation bit.

During an execution phase of operation following the computation phase, the pre-charge transistor P1 is switched off to float the read bit line with respect to the node for the common-mode voltage VCM. If the activation bit is a binary one, the closed/opened switching state of the L and R switches in the execution phase is reversed from whatever switching state the L and R switches were in during the computation phase. In other words, if the L or R switch was closed during the computation phase, the same switch would be opened during the execution phase if the activation bit is a binary one. Similarly, if the L or R switch were opened during the computation phase, the same switch would be closed during the execution phase if the activation bit is a binary one. If the activation bit is a binary zero, the closed/opened switching state of the L and R switches from the computation phase is left unchanged during the execution phase.

Note the differences between ternary and XNOR-based operation for a capacitive CiM bitcell. In the XNOR-based operation, the accumulation phase always grounds the output node 105. But the binary state of the output node 105 in a ternary execution phase may be a one (charged to the power supply voltage VDD) or a zero (discharged to ground). During the execution phase, the output node 105 may thus be boosted from ground to the power supply voltage (VDD), remain discharged to ground, remain charged to the power supply voltage VDD, or be discharged from the power supply voltage VDD to ground. Given these four potential outcomes for the output node voltage, one can thus appreciate that the resulting operation is indeed ternary as the read bit line voltage may be boosted above the common mode voltage VCM if the output node voltage transitions from ground to VDD in the execution phase. Conversely, the read bit line voltage is left unchanged (equal to the common mode voltage) if the output node remains grounded in both the computation and execution phases. Similarly, the read bit line voltage is unchanged if the output node remains charged to the power supply voltage VDD in both the computation and execution phases. Finally, the read bit line voltage is decreased from the common mode voltage in the execution phase if the output node voltage transitions from the power supply voltage VDD in the computation phase to ground in the execution phase.

In an XNOR-based computation, the accumulation phase can only discharge the read bit line voltage from the common-mode voltage, there is no increasing of the read bit line voltage from the common-mode voltage. The output voltage swing of the read bit line in a ternary-based computation is thus twice the output voltage swing that is produced from an XNOR-based computation. This increased output voltage swing of a ternary-based computation is advantageous with regard to reducing analog-to-digital conversion noise in the computation as will be explained further herein.

Figure 4:
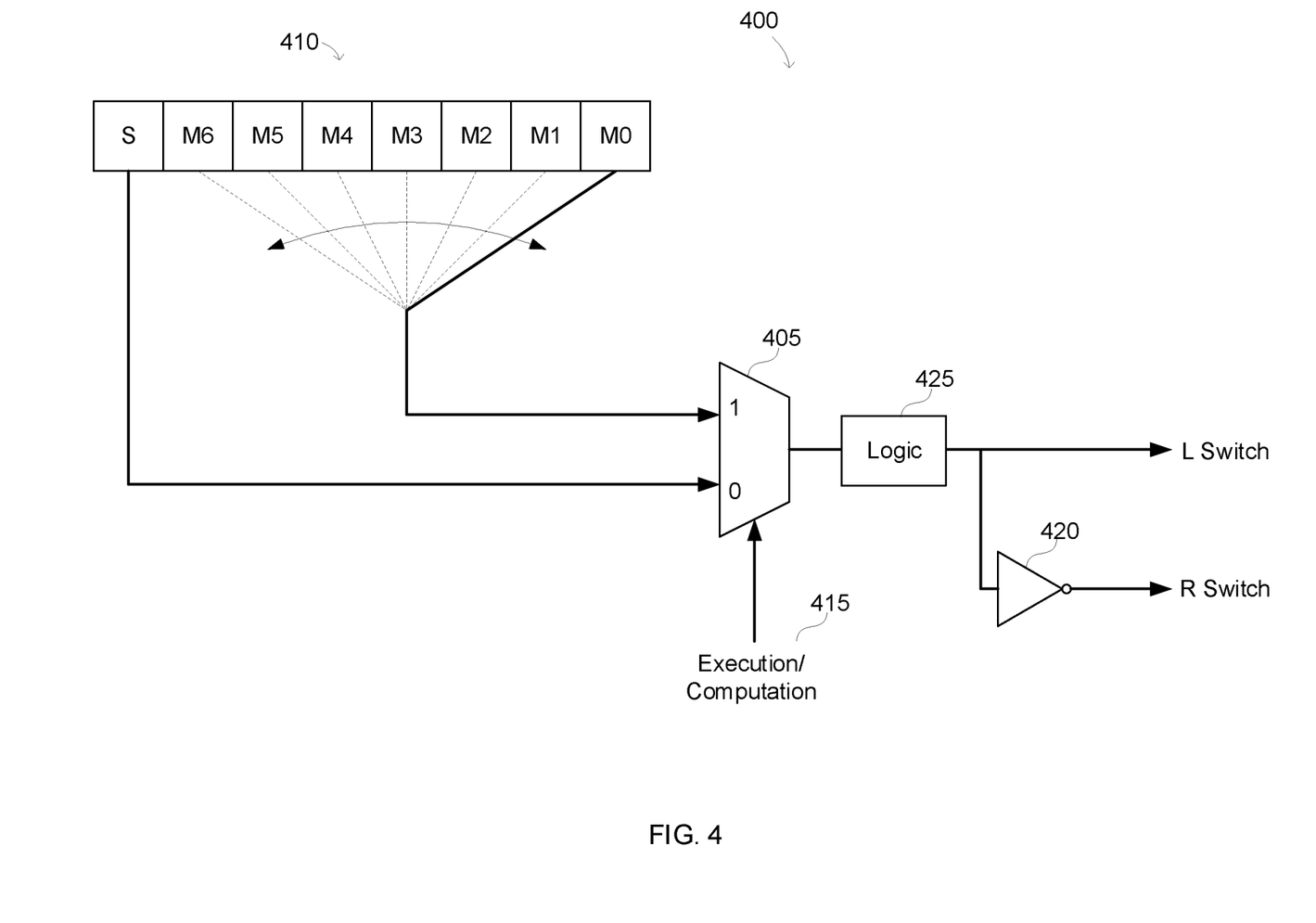
FIG. 4 illustrates aspects of a controller for selecting from an input buffer during a ternary computation for a compute-in-memory bitcell in accordance with an aspect of the disclosure.

The ternary computation will thus function differently from an XNOR-based computation. In an XNOR-based computation, there is no sign bit so the L and R switches are both opened during the pre-charge phase (if present), a controller then controls these switches based on the activation bit during the computation phase. But in a ternary computation, a controller 400 of the L and R switches will look to the sign bit during the computation phase to control the left and right switches and then look to the activation bit during the execution phase as shown in FIG. 4. For example, the signed activation vector may be stored in a buffer 410 including a first storage element and a plurality of additional storage elements. A computation/execution control signal 415 for controller 400 controls the selection from buffer 410 by a multiplexer 405 depending upon whether the computation phase or execution phase is active. In the computation phase, control signal 415 controls multiplexer 405 to select for the sign bit from a first storage element in buffer 410. The sign bit is then used by a logic circuit 425 during the computation phase to form the activation bit signal (Act) and the complement activation bit signal ActB that control the opened/closed state of the L switch (in a transmission gate implementation). An inverter 420 is conceptual to signify that the switching state of the R switch is complementary to that of the L switch. As discussed with regard to bitcell 200, the Act and ActB activation bit signals control the switching states of the R switch in addition to that of the L switch.

In the execution phase following the computation phase, the control signal 415 controls the selection of an activation bit from a plurality of additional storage elements in buffer 410 depending upon the magnitude (bit significance) of the current calculation. For example, a first execution cycle may start from an LSB activation bit M0. In successive execution cycles, the next-most-significant activation bit is selected. In buffer 410, the activation bits range from an LSB activation bit M0 to an MSB activation bit M6. It will be appreciated, however, that an alternative arrangement of bits may be used such as selecting from the MSB to the LSB in other implementations. The multiplication of such a signed seven-bit-wide activation vector thus involves seven successive computation and execution phases, each execution phase being directed to a respective activation bit and each computation phase being responsive to the same sign bit. Depending upon the binary value of the selected activation bit, logic circuit 425 either reverses the opened/closed switching states of the L and R switches in the execution phase from what they were in the computation phase or leave them unchanged as discussed with regard to Table 2. Following the execution phase, the ternary-based multiplication of the signed activation bit with the stored filter weight bit is sensed from the read bit line voltage such as through an analog-to-digital converter as will be discussed further herein.

Figure 5:
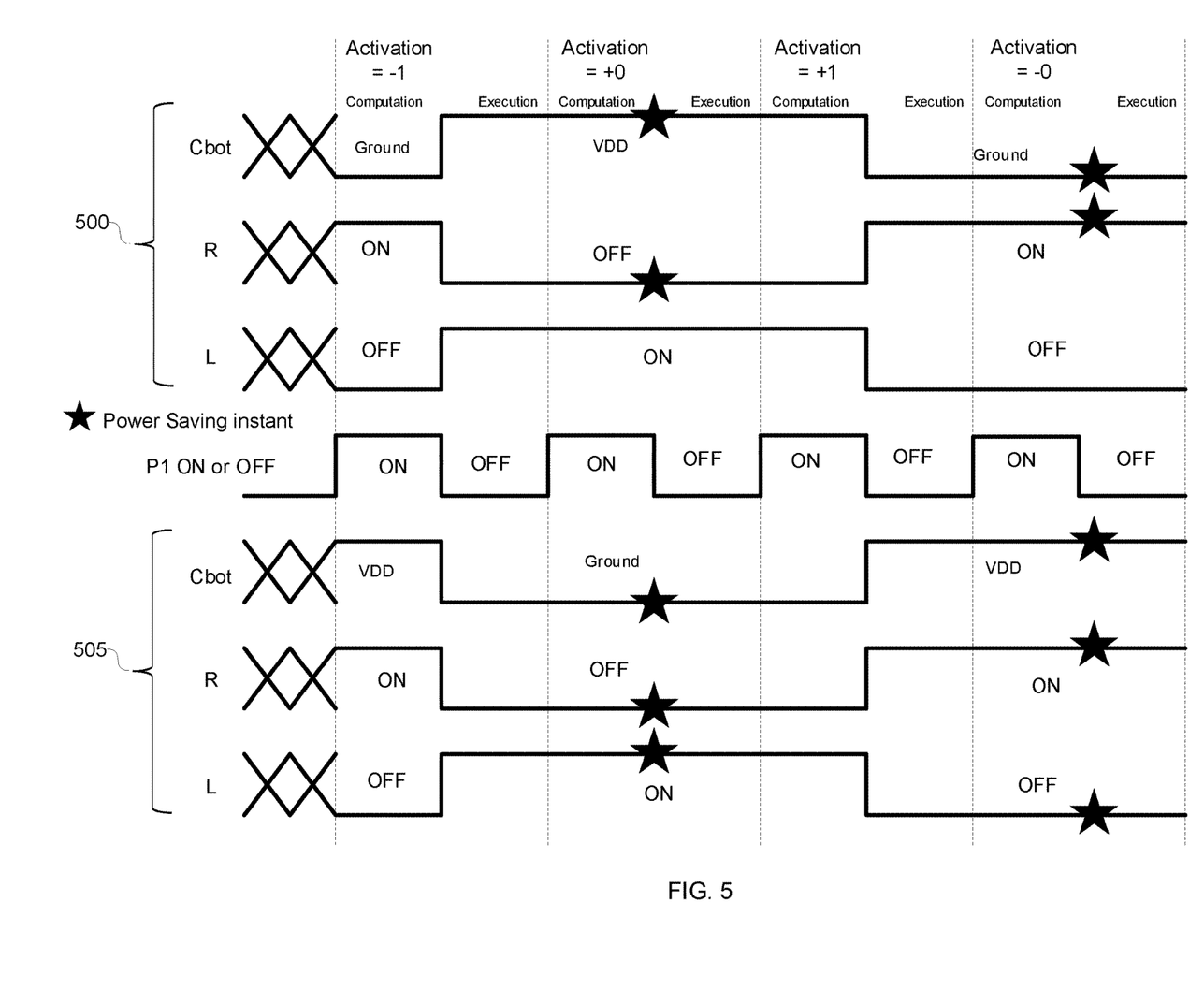
FIG. 5 illustrates some operating waveforms for a compute-in-memory bitcell performing a ternary computation in accordance with an aspect of the disclosure.

The advantageous reduced power consumption of the ternary-based computation may be better appreciated with regard to the example switching waveforms for four exemplary computation and execution cycles of FIG. 5. In a first set of waveforms 500, the filter weight bit is a binary one. In a second set of waveforms 505, the filter weight bit is a binary zero. The on and off state of the pre-charge transistor P1 is common to both of the waveforms 500 and 505 for the successive computation and execution phases. In these waveforms, the binary state (charged to the power supply voltage VDD or grounded) of a bottom plate of capacitor C is denoted as Cbot. This bottom plate is the plate of capacitor C that connects to the output node 105. In contrast, the plate of capacitor C that connects to the read bit line may be denoted as the top plate.

As noted earlier, the multiplication of the sign bit with the activation bit to form a signed activation bit leads to one of four possible values: +1, +0, −0, and −1. Waveform 500 begins with the computation phase for the −1 value. In the computation phase, the R switch is on and the L switch is off due to the negative sign of the −1 activation. Since the filter weight bit is a binary one, the complement filter weight bit is a binary zero. This binary zero conducts through the switched-on R switch to ground the Cbot plate. In the execution phase, the binary one magnitude for the activation bit forces a reversal of the L and R switching states. The L switch is thus on and the R switch is off for the −1 execution phase. The switching on of the L switch allows the binary one value for the filter weight bit to charge the Cbot plate of the capacitor C to the power supply voltage VDD.

Following the −1 activation is a +0 activation value for the 500 waveform. The L switch thus remains on in the computation phase for the +0 activation whereas the R switch remains off. The Cbot voltage thus remains charged to the power supply voltage VDD during this computation phase. In the subsequent execution phase for the +0 activation, the switching states are unchanged since the magnitude of the +0 activation is zero. The Cbot voltage thus remains charged to the power supply voltage VDD. This represents a reduced power consumption over a traditional XNOR-based approach in which the Cbot voltage is always grounded during the accumulation phase.

A +1 activation follows the +0 activation. In waveform 500, the L switch is thus on during the computation phase for the +1 activation whereas the R switch is off. The switching on of the L switch allows the binary one value for the filter weight bit to continue charging the Cbot voltage to the power supply voltage VDD. In the subsequent execution phase, the switching states for the L and R switches are reversed so that the Cbot voltage is grounded due to the switching on of the R switch.

A −0 activation follows the +1 activation (note that the order of the activations is dependent on the activation vector being processed, waveforms 500 and 505 use a particular order of activations so that all possible activation values are shown). Since the activation has a negative sign, the R switch is closed and the L switch is opened during the computation phase for the −0 activation in waveform 500 to continue the grounding of the Cbot voltage. In the subsequent execution phase, the R switch remains closed and the L switch remains opened because of the binary zero for the activation magnitude. The Cbot voltage thus remains unchanged during the computation and execution cycle for the −0 activation, which is also a reduced power consumption as compared to the changing Cbot voltage that would have occurred if a conventional XNOR-based computation had been performed.

The waveform 505 will now be discussed. As noted earlier, the filter weight bit is a binary zero for waveform 505. The R and L switching states (on or off) will be as discussed for waveform 500 since these switching states depend only on the activation. For the +0 activation, waveform 505 represents a power saving over the conventional XNOR-based approach since the Cbot voltage remains grounded. In particular, the Cbot voltage is grounded during the computation phase for the +0 activation since the L switch will be on, which allows the grounded filter weight bit to flow through the L switch to ground the bottom plate of the capacitor C. This grounded state for the Cbot voltage remains unchanged during the execution phase for the +0 activation since the binary zero magnitude leaves the switching states for the L and R switches unchanged from the computation phase values. In addition, the −0 activation for the 505 waveform also represents a power saving over a traditional XNOR-based approach. In particular, the negative value of the −0 activation causes the R switch to be on and the L switch to be off during the computation phase for the −0 activation, which allows the binary-high value of the complement filter weight bit to flow through the closed R switch and charge the Cbot voltage to the power supply voltage VDD. The switching states then remain unchanged during the subsequent execution phase for the −0 activation in waveform 505 due to the binary zero magnitude of the −0 activation. The Cbot voltage thus remains charged to the power supply voltage during the execution phase for the −0 activation. In contrast, the Cbot voltage would have been grounded in an XNOR-based computation.

Some Example CiM Bitcell Arrays

Figure 6:
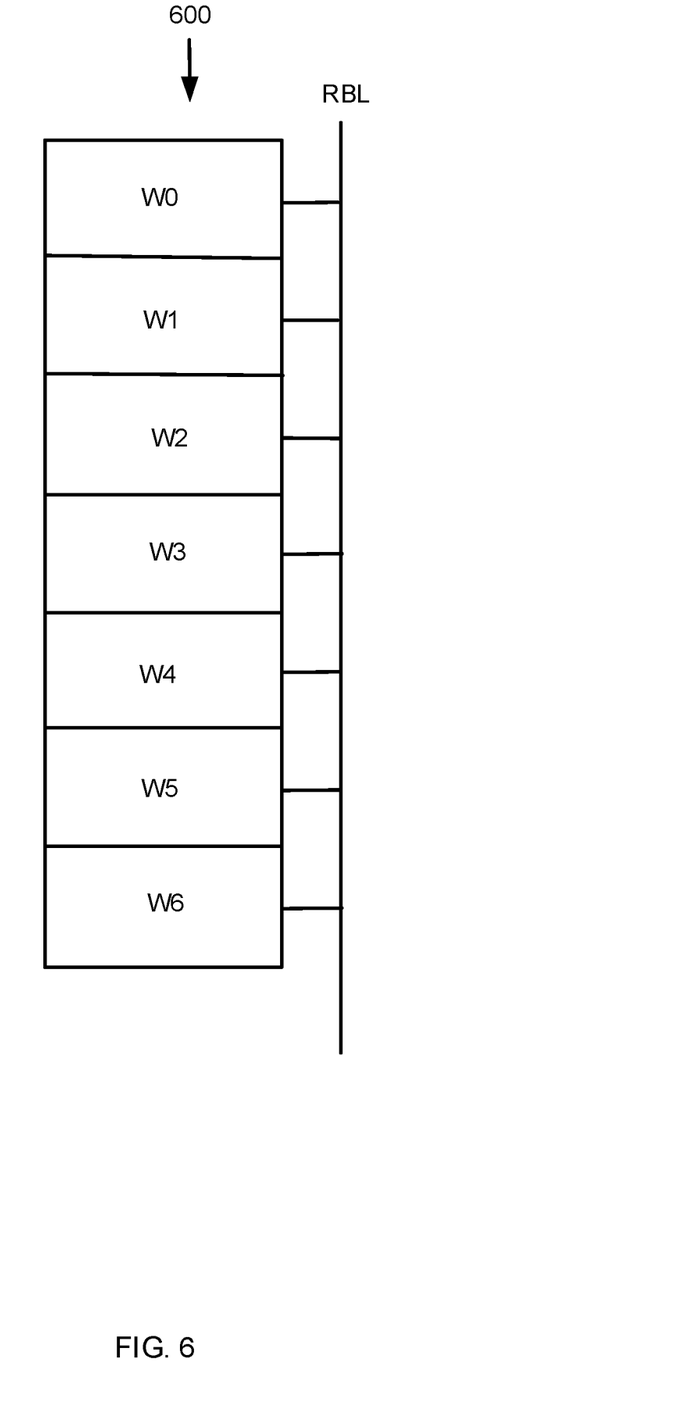
FIG. 6 illustrates a column of compute-in-memory bitcells configured for ternary computation and organized to form a multiply-and-accumulate (MAC) circuit in accordance with an aspect of the disclosure.

CiM bitcells configured for ternary-based computation as disclosed herein may be organized to form a multiply-and-accumulate (MAC) circuit. An example MAC circuit 600 shown in FIG. 6 will now be discussed. MAC circuit 600 includes a plurality of CiM bitcells each implemented such as discussed for CiM bitcells 100, 200, or 300. In general, the number of bitcells included in MAC circuit 600 will depend upon the filter size. For illustration clarity, MAC circuit 600 is shown as including a column of just seven CiM bitcells ranging from a zeroth bitcell storing a zeroth filter weight bit W0 to a sixth bitcell storing a sixth-filter weight bit W6. The read bit line RBL extends across the column. Each bitcell operates as discussed with regard to bitcell 100, 200, or 300 during a ternary-based computation as discussed with regard to FIGS. 4, 5, and Table 2.

Figure 7:
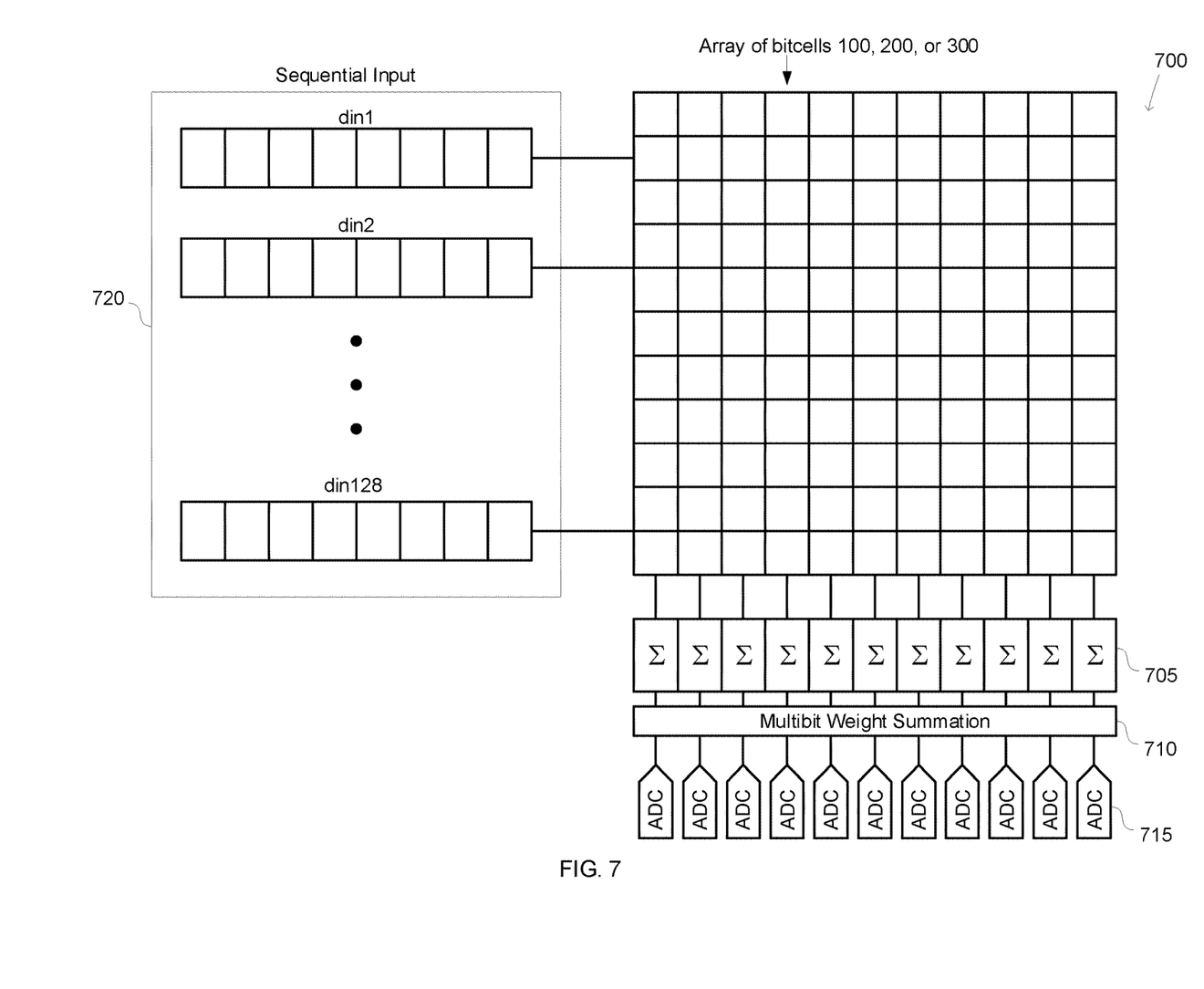
FIG. 7 illustrates a memory including an array having a plurality of columns, each column including a multiply-and-accumulate circuit configured for ternary computation in accordance with an aspect of the disclosure.

A plurality of MAC circuits may be arranged to form a memory including a memory array 700 as shown in FIG. 7. Each column of bitcells 100, 200, or 300 forms a corresponding MAC circuit. For example, the filter size is 128 in array 700 so that each column in array 700 has 128 bitcells 100, 200, or 300. An activation vector 720 will thus have 128 input samples. In memory array 700, each input sample is a multiple-bit input sample. For any given computation and execution phase, an activation bit is selected from each multi-bit sample to produce a plurality of activation bits ranging from a first activation bit din1 to a 128th activation bit din128. The sign bit for each activation vector 720 is not illustrated but would be included as discussed with regard to buffer 410. After a write operation to write the filter weight bits to memory array 700, each activation vector 720 is sampled sequentially so that each MAC circuit performs a computation phase in which the respective activation bits are multiplied by the corresponding filter weight bits. The computation phase is followed by the execution phase. Note that in an XNOR-based approach, the execution phase is denoted as an accumulation phase since the output node 105 for each bitcell in a MAC circuit is grounded. The charge from the various capacitors C in the MAC circuit is thus accumulated onto the corresponding read bit line. But in a ternary-based computation, the charge on the capacitors C is not accumulated in the same fashion during the execution phase since the various output nodes 105 may be grounded or remain charged as discussed previously. However, the execution phase achieves the same goal in that the read bit line voltage will represent a summation (accumulation) of the computation results for all the CiM bitcells within a MAC circuit. But unlike an XNOR-based calculation, note that the activation vectors 720 may have both odd and even signed values so the computation precision is increased. In addition, the charging and discharging of the bottom plate of the capacitor C is decreased as noted with regard to FIG. 5. Note that each input sample such as din1 may be a multi-bit input sample. For example, din1 may be a three-bit wide sample din1. Since each CiM bitcell performs a binary multiplication, the various bits in the multi-bit input samples are sequentially processed by each MAC circuit in array 700. A sequential integrator 705 for each MAC circuit thus functions to weight the accumulation results according to the weight (bit significance) of the multi-bit input samples. For example, suppose each sample of input vector 720 is a three-bit-wide sample ranging from a least-significant bit (LSB) sample to a most-significant bit (MSB) sample. Each sequential integrator 705 thus sums the accumulation results according to their bit significance. In addition, the filter weights themselves may be multi-bit filter weights. Since each CiM bitcell stores a binary filter weight, one MAC circuit may be used for one filter weight bit (e.g, the LSB weight), a neighboring MAC circuit may be used for the next-most-significant filter weight bit, and so on. In such an embodiment three adjacent MAC circuits would be used for a three-bit-wide filter weight embodiment. A multi-bit weight summation circuit 710 accumulates the corresponding MAC accumulation values (as processed through the corresponding sequential integrators 705 as necessary in the case of multi-bit input samples) and sums the MAC accumulation values according to the binary weights of the filter weight bits. Finally, an analog-to-digital converter (ADC) 715 digitizes the final accumulation result. This digitization is significantly improved, however, due to doubling of the output voltage swing on the read bit line that the ternary activation provides as discussed earlier.

Figure 8:
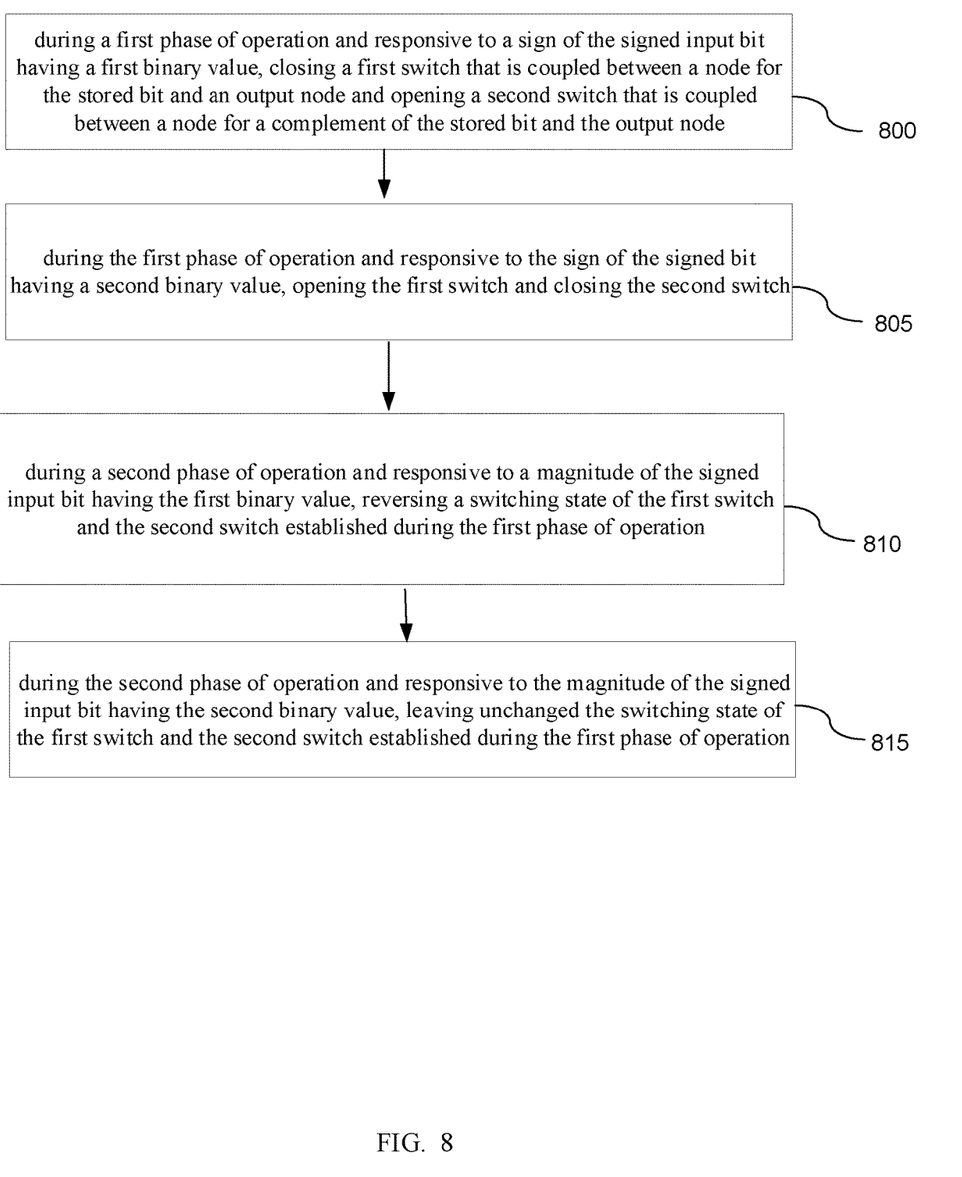
FIG. 8 is a flowchart for an example ternary computation for a compute-in-memory bitcell in accordance with an aspect of the disclosure.

A method of controlling a CiM bitcell to multiply a stored bit with a signed input bit will now be discussed with reference to the flowchart of FIG. 8. The method includes an act 800 that occurs during a first phase of operation and is responsive to a sign of the signed input bit having a first binary value and includes closing a first switch that is coupled between a node for the stored bit and an output node and opening a second switch that is coupled between a node for a complement of the stored bit and the output node. The closing of the L switch and the opening of the R switch responsive to the activation being positive is an example of act 800. The method also includes an act 805 that occurs during the first phase of operation and is responsive to the sign of the signed bit having a second binary value and includes opening the first switch and closing the second switch. The opening of the L switch and closing of the R switch responsive to the activation being negative is an example of act 805. The method further includes an act 810 that occurs during a second phase of operation and is responsive to a magnitude of the signed input bit having the first binary value and includes reversing a switching state of the first switch and the second switch established during the first phase of operation. The switching of the switching state for the L and R switches responsive to the magnitude of the activation being a binary one is an example of act 810. Finally, the method includes an act 815 that occurs during the second phase of operation and is responsive to the magnitude of the signed input bit having the second binary value and includes leaving unchanged the switching state of the first switch and the second switch established during the first phase of operation. The control of the L and R switches during the execution phase to have the same switching state as was established in the computation phase responsive to the magnitude of the activation being a binary zero is an example of act 815.

Figure 9:
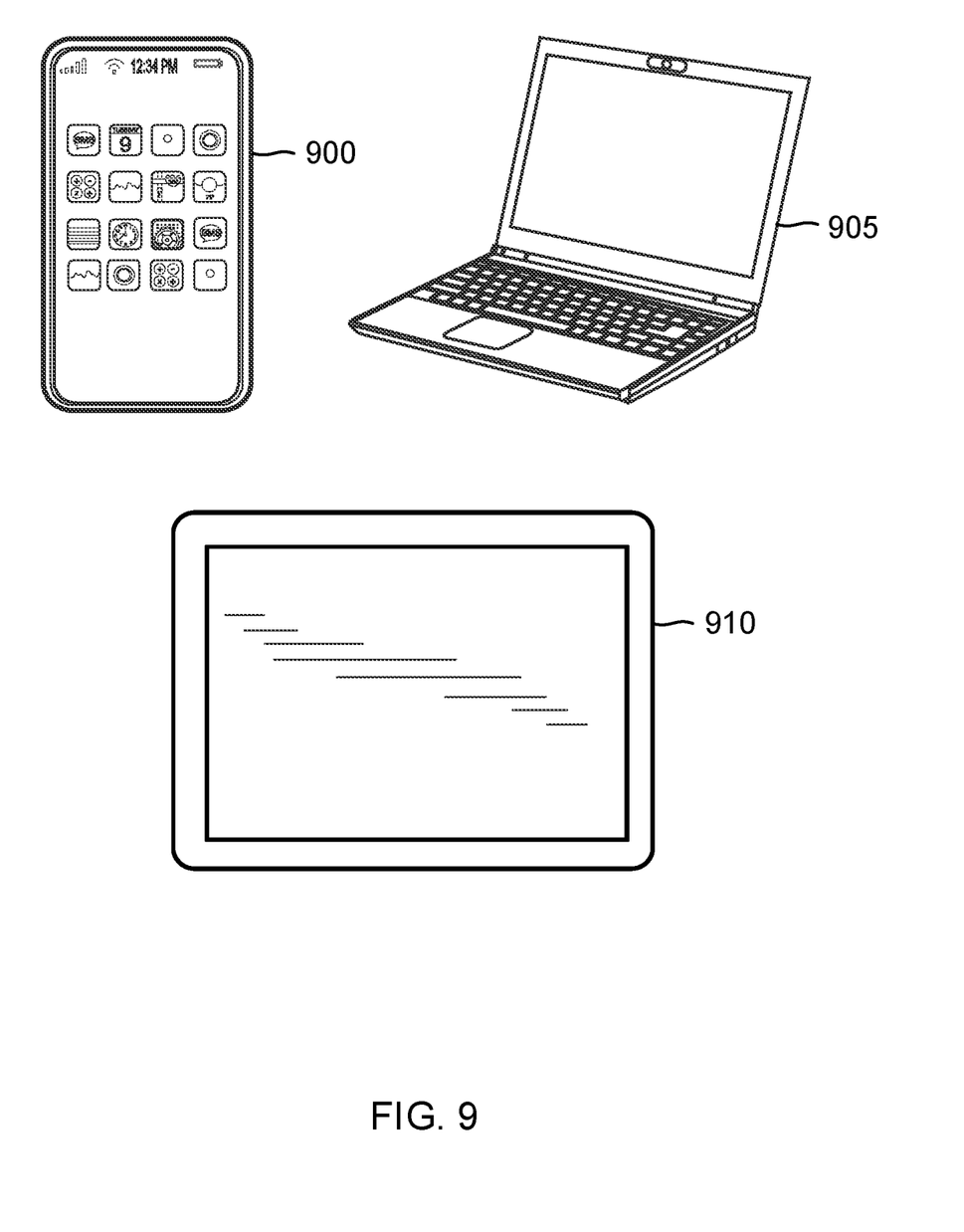
FIG. 9 illustrates some example electronic systems each incorporating an array of compute-in-memory bitcells configured for ternary computation in accordance with an aspect of the disclosure.

A compute-in-memory bitcell with ternary activation as disclosed herein may be advantageously incorporated in any suitable mobile device or electronic system. For example, as shown in FIG. 9, a cellular telephone 900, a laptop computer 905, and a tablet PC 910 may all include a compute-in-memory having compute-in-memory bitcells such as for machine learning applications in accordance with the disclosure. Other exemplary electronic systems such as a music player, a video player, a communication device, and a personal computer may also be configured with compute-in-memories constructed in accordance with the disclosure.

The disclosure will now be summarized in the following series of example clauses:

Clause 1. A memory, comprising:
a bitcell having a pair of switches connected to an output node;
a capacitor coupled to the output node;
a first storage element and a plurality of additional storage elements; and
controller configured to select a first bit from the first storage element to control the pair of switches responsive to the first bit during a first phase of operation for the memory and configured to select a second bit from the plurality of additional storage elements to control the pair of switches responsive to the second bit during a second phase of operation for the memory.

Clause 2. The memory of clause 1, further comprising:
a bit line, wherein the capacitor includes a first terminal coupled to the output node and a second terminal coupled to the bit line.

Clause 3. The memory of any of clauses 1-2, wherein the first storage element is configured to store a sign bit and the plurality of additional storage elements are configured to store a plurality of magnitude bits.

Clause 4. The memory of clause 3, wherein the controller includes a multiplexer configured to select the sign bit during the first phase of operation and to select second bit from the plurality of magnitude bits during the second phase of operation.

Clause 5. The memory of clause 4, wherein the controller is further configured during the first phase of operation to close a first switch in the pair of switches and to open a second switch in the pair of switches responsive to the first bit having a first binary value and to open the first switch and to close the second switch responsive to the second bit having a second binary value that is a complement of the first binary value.

Clause 6. The memory of clause 5, wherein the controller is further configured during the second phase of operation to reverse a switching state of the first switch and the second switch responsive to the second bit having the first binary value and to maintain a switching state of the first switch and the second switch responsive to the second bit having the second binary value.

Clause 7. The memory of any of clauses 2-6, wherein the bitcell comprises a first inverter that is cross-coupled with a second inverter, and wherein the pair of switches includes a first switch coupled between an output node of the first inverter and the output node and includes a second switch coupled between an output node of the second inverter and the output node.

Clause 8. The memory of clause 7, wherein the first switch comprises a first transmission gate and wherein the second switch comprises a second transmission gate.

Clause 9. The memory of any of clauses 7-8, wherein the first switch and the second switch are the only switches coupled to the output node.

Clause 10. The memory of clause 7, further comprising a third switch coupled between the output node and ground.

Clause 11. The memory of clause 10, wherein the controller is further configured to switch on the third switch during a pre-charge phase of operation prior to the first phase of operation and to switch off the third switch during the first phase of operation and during the second phase of operation.

Clause 12. The memory of any of clauses 10-11, wherein the first switch is a first p-type metal-oxide semiconductor (PMOS) transistor, the second switch is a second PMOS transistor, and the third switch is an n-type metal-oxide semiconductor (NMOS) transistor.

Clause 13. The memory of clause 7, further comprising: a third switch coupled between a node for common-mode voltage and the bit line, wherein the controller is further configured to close the third switch during the first phase of operation and to open the third switch during the second phase of operation.

Clause 14. The memory of clause 13, wherein the third switch is a first PMOS transistor.

Clause 15. The memory of any of clauses 1-14, wherein the memory is incorporated into a cellular telephone.

Clause 16. A method of controlling a bitcell to multiply a stored bit with a signed input bit, comprising:
  during a first phase of operation and responsive to a sign of the signed input bit having a first binary value, closing a first switch that is coupled between a node for the stored bit and an output node and opening a second switch that is coupled between a node for a complement of the stored bit and the output node;
  during the first phase of operation and responsive to the sign of the signed bit having a second binary value, opening the first switch and closing the second switch;
  during a second phase of operation and responsive to a magnitude of the signed input bit having the first binary value, reversing a switching state of the first switch and the second switch established during the first phase of operation; and
  during the second phase of operation and responsive to the magnitude of the signed input bit having the second binary value, leaving unchanged the switching state of the first switch and the second switch established during the first phase of operation.

Clause 17. The method of clause 16, wherein the first binary value is a binary one value and wherein the second binary value is a binary zero value.

Clause 18. The method of any of clauses 16-17, further comprising:
  during the first phase of operation, connecting a bit line to a node for a common-mode voltage, wherein the bit line is coupled to the output node through a capacitor.

Clause 19. The method of clause 18, further comprising:
  disconnecting the bit line from the node for the common-mode voltage during the second phase of operation.

Clause 20. A memory, comprising:
  a bitcell configured to store a stored bit, the bitcell including a first switch coupled between a node for the stored bit and an output node and a second switch coupled between a node for a complement of the stored bit and the output node;
  a capacitor having a first plate connected to the output node; and
  a controller configured to open the second switch and to close the first switch responsive to a sign bit of an input word having a first binary value and to open the first switch and to close the second switch responsive to the sign bit having a second binary value to control a switching state of the first switch and of the second switch in a first phase of operation, wherein the second binary value is a complement of the first binary value.

Clause 21. The memory of clause 20, further comprising:
  a bit line coupled to a second plate of the capacitor.

Clause 22. The memory of any of clauses 20-21, further comprising:
  an input buffer for storing the input word, wherein the controller is further configured during a second phase of operation to reverse the switching state of the first switch and of the second switch responsive to a selected magnitude bit in the input buffer having the first binary value.

Clause 23. The memory of clause 22, wherein the controller is further configured during the second phase of operation to maintain the switching state of the first switch and of the second switch responsive to the selected magnitude bit in the input buffer having the second binary value.

Clause 24. The memory of any of clauses 20-23, wherein the memory is included in a multiply-and-accumulate circuit including a plurality of additional bitcells, each additional bitcell including a corresponding capacitor.

Clause 25. The memory of clause 24, further comprising a memory array including a plurality of columns, and wherein the multiply-and-accumulate circuit is configured to form a column in the plurality of columns.

Clause 26. The memory of clause 25, further comprising:
  a plurality of analog-to-digital converters corresponding to the plurality of columns on a one-to-one basis.

Clause 27. The memory of clause 26, wherein each analog-to-digital converter is a multi-bit analog-to-digital converter.

Clause 28. A method of operation for a compute-in-memory, comprising:
  during a first phase of operation, controlling a pair of switches coupled between a pair of inverters in a bitcell and a plate of a capacitor responsive to a sign bit; and
  during a second phase of operation controlling the pair of switches responsive to a magnitude bit.

Clause 29. The method of clause 28, wherein controlling the pair of switches during the first phase of operation comprises closing a first switch in the pair of switches and opening a second switch in the pair of switches responsive to the sign bit having a first binary value.

Clause 30. The method of clause 29, wherein controlling the pair of switches during the first phase of operation further comprises opening the first switch and closing the second switch responsive to the sign bit having a second binary value that is a complement of the first binary value.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A memory, comprising:
   a bitcell having a pair of switches connected to an output node;
   a capacitor coupled to the output node;
   a first storage element and a plurality of additional storage elements; and
   controller configured to select a first bit from the first storage element to control the pair of switches responsive to the first bit during a first phase of operation for the memory and configured to select a second bit from the plurality of additional storage elements to control the pair of switches responsive to the second bit during a second phase of operation for the memory,
   wherein the controller is further configured during the first phase of operation to close a first switch in the pair of switches and to open a second switch in the pair of switches responsive to the first bit having a first binary value and to open the first switch and to close the second switch responsive to the first bit having a second binary value that is a complement of the first binary value, and
   wherein the controller is further configured during the second phase of operation to reverse a switching state of the first switch and the second switch responsive to the second bit having the first binary value and to maintain a switching state of the first switch and the second switch responsive to the second bit having the second binary value.

2. The memory of claim 1, further comprising:
   a bit line, wherein the capacitor includes a first terminal coupled to the output node and a second terminal coupled to the bit line.

3. The memory of claim 1, wherein the first storage element is configured to store a sign bit and the plurality of additional storage elements are configured to store a plurality of magnitude bits.

4. The memory of claim 3, wherein the controller includes a multiplexer configured to select the first bit during the first phase of operation and to select the second bit during the second phase of operation.

5. The memory of claim 1, wherein the bitcell comprises a first inverter that is cross-coupled with a second inverter, and wherein the pair of switches includes a first switch coupled between an output node of the first inverter and the output node and includes a second switch coupled between an output node of the second inverter and the output node.

6. The memory of claim 5, wherein the first switch comprises a first transmission gate and wherein the second switch comprises a second transmission gate.

7. The memory of claim 5, wherein the first switch and the second switch are the only switches coupled to the output node.

8. A memory, comprising:
   a bitcell having a pair of switches connected to an output node, wherein the bitcell comprises a first inverter that is cross-coupled with a second inverter, and wherein the pair of switches includes a first switch coupled between an output node of the first inverter and the output node and includes a second switch coupled between an output node of the second inverter and the output node;
   a capacitor coupled to the output node;
   a first storage element and a plurality of additional storage elements; and
   controller configured to select a first bit from the first storage element to control the pair of switches responsive to the first bit during a first phase of operation for the memory and configured to select a second bit from the plurality of additional storage elements to control the pair of switches responsive to the second bit during a second phase of operation for the memory, and
   a third switch coupled between the output node and ground.

9. The memory of claim 8, wherein the controller is further configured to switch on the third switch during a pre-charge phase of operation prior to the first phase of operation and to switch off the third switch during the first phase of operation and during the second phase of operation.

10. The memory of claim 8, wherein the first switch is a first p-type metal-oxide semiconductor (PMOS) transistor, the second switch is a second PMOS transistor, and the third switch is an n-type metal-oxide semiconductor (NMOS) transistor.

11. The memory of claim 5, further comprising: a third switch coupled between a node for common-mode voltage and the bit line, wherein the controller is further configured to close the third switch during the first phase of operation and to open the third switch during the second phase of operation.

12. The memory of claim 11, wherein the third switch is a first PMOS transistor.

13. The memory of claim 1, wherein the memory is incorporated into a cellular telephone.

14. A method of controlling a bitcell to multiply a stored bit with a signed input bit, comprising:
   during a first phase of operation and responsive to a sign of the signed input bit having a first binary value, closing a first switch that is coupled between a node for the stored bit and an output node and opening a second switch that is coupled between a node for a complement of the stored bit and the output node;
   during the first phase of operation and responsive to the sign of the signed bit having a second binary value, opening the first switch and closing the second switch;
   during a second phase of operation and responsive to a magnitude of the signed input bit having the first binary value, reversing a switching state of the first switch and the second switch established during the first phase of operation; and
   during the second phase of operation and responsive to the magnitude of the signed input bit having the second binary value, maintaining the switching state of the first switch and the second switch established during the first phase of operation.

15. The method of claim 14, wherein the first binary value is a binary one value and wherein the second binary value is a binary zero value.

16. The method of claim 14, further comprising:

during the first phase of operation, connecting a bit line to a node for a common-mode voltage, wherein the bit line is coupled to the output node through a capacitor.

17. The method of claim 16, further comprising:

disconnecting the bit line from the node for the common-mode voltage during the second phase of operation.

18. A memory, comprising:

a bitcell configured to store a stored bit, the bitcell including a first switch coupled between a node for the stored bit and an output node and a second switch coupled between a node for a complement of the stored bit and the output node;

a capacitor having a first plate connected to the output node;

a controller configured to open the second switch and to close the first switch responsive to a sign of an input word having a first binary value and to open the first switch and to close the second switch responsive to the sign of the input word having a second binary value to control a switching state of the first switch and of the second switch during a first phase of operation, wherein the second binary value is a complement of the first binary value; and an input buffer for storing the input word, wherein the controller is further configured during a second phase of operation to reverse the switching state of the first switch and of the second switch responsive to a selected magnitude bit in the input buffer having the first binary value.

19. The memory of claim 18, further comprising:

a bit line coupled to a second plate of the capacitor.

20. The memory of claim 18, wherein the controller is further configured during the second phase of operation maintain the switching state of the first switch and of the second switch responsive to the selected magnitude bit in the input buffer having the second binary value.

21. The memory of claim 20, wherein the memory is included in a multiply-and-accumulate circuit including a plurality of additional bitcells, each additional bitcell including a corresponding capacitor.

22. The memory of claim 21, further comprising a memory array including a plurality of columns, and wherein the multiply-and-accumulate circuit is configured to form a column in the plurality of columns.

23. The memory of claim 22, further comprising:

a plurality of analog-to-digital converters corresponding to the plurality of columns on a one-to-one basis.

24. The memory of claim 23, wherein each analog-to-digital converter is a multi-bit analog-to-digital converter.

25. A method of operation for a compute-in-memory, comprising:

during a first phase of operation, controlling a pair of switches coupled between a bitcell and a plate of a capacitor responsive to a sign bit;

during a second phase of operation controlling the pair of switches responsive to a magnitude bit;

wherein controlling the pair of switches during the first phase of operation comprises closing a first switch in the pair of switches and opening a second switch in the pair of switches responsive to the sign bit having a first binary value; and wherein controlling the pair of switches during the first phase of operation further comprises opening the first switch and closing the second switch responsive to the sign bit having a second binary value that is a complement of the first binary value.

* * * * *